United States Patent
Chockalingam et al.

(10) Patent No.: US 10,170,437 B1
(45) Date of Patent: Jan. 1, 2019

(54) VIA DISGUISE TO PROTECT THE SECURITY PRODUCT FROM DELAYERING AND GRAPHIC DESIGN SYSTEM (GDS) HACKING AND METHOD FOR PRODUCING THE SAME

(71) Applicant: GLOBALFOUNDRIES Singapore Pte. Ltd., Singapore (SG)

(72) Inventors: Ramasamy Chockalingam, Singapore (SG); Juan Boon Tan, Singapore (SG); Sung Mun Jung, Singapore (SG); Wenhu Liu, Singapore (SG); Ee Jan Khor, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/714,503

(22) Filed: Sep. 25, 2017

(51) Int. Cl.
*H01L 23/00* (2006.01)
*H01L 21/311* (2006.01)
(Continued)

(52) U.S. Cl.
CPC ........ *H01L 23/57* (2013.01); *H01L 21/31116* (2013.01); *H01L 21/31144* (2013.01); *H01L 21/7684* (2013.01); *H01L 21/76807* (2013.01); *H01L 21/76814* (2013.01); *H01L 21/76816* (2013.01); *H01L 21/76834* (2013.01); *H01L 21/76877* (2013.01); *H01L 23/528* (2013.01);
(Continued)

(58) Field of Classification Search
CPC ............... H01L 23/57; H01L 21/31116; H01L 21/31144; H01L 21/76807; H01L 21/76814; H01L 21/76816; H01L 21/76834; H01L 21/7684; H01L 21/76877; H01L 23/5226; H01L 23/528; H01L 23/53214; H01L 23/53228; H01L 23/53257; H01L 23/53295
USPC .......................................................... 257/758
See application file for complete search history.

(56) References Cited

U.S. PATENT DOCUMENTS

| 8,151,235 B2 | 4/2012 | Chow et al. | |
| 2004/0232558 A1* | 11/2004 | Toda | H01L 21/76807 257/774 |
| 2011/0079907 A1* | 4/2011 | Farooq | H01L 23/53238 257/751 |

OTHER PUBLICATIONS

Disclosed Anonymously, "Method to implement a nonfunctional transistor and device to prevent IC reverse engineerin, and counterfeiting", IP. com Electronic Publication Date Nov. 15, 2012, The IP.com Prior Art Database, retrieved on Jun. 14, 2017 from "http://priorart.ip.com/IPCOM/000231099", 6 pages.

* cited by examiner

Primary Examiner — Hrayr A Sayadian
(74) Attorney, Agent, or Firm — Ditthavong & Steiner, P.C.

(57) ABSTRACT

A method of forming a stop layer to prevent dummy vias from connecting to a metal layer and the resulting device are provided. Embodiments include forming a first metal layer in a first dielectric layer; forming a second dielectric layer over a first Nblok layer formed over the first dielectric and first metal layers; forming a third dielectric layer over the second dielectric layer and a second Nblok layer formed over a portion of the second dielectric layer; forming a via and a plurality of vias through the third and second dielectric layers down to the second and first Nblok layers, respectively; removing portions of the second and first Nblok layers through the via and the plurality of vias down to the second dielectric layer and the first metal layer, respectively;

(Continued)

removing portions of the third dielectric layer through each via; and filling each via with a second metal layer.

20 Claims, 3 Drawing Sheets

(51) Int. Cl.
    *H01L 23/528*     (2006.01)
    *H01L 23/532*     (2006.01)
    *H01L 21/768*     (2006.01)
    *H01L 23/522*     (2006.01)

(52) U.S. Cl.
    CPC .... *H01L 23/5226* (2013.01); *H01L 23/53214* (2013.01); *H01L 23/53228* (2013.01); *H01L 23/53257* (2013.01); *H01L 23/53295* (2013.01)

US 10,170,437 B1

VIA DISGUISE TO PROTECT THE SECURITY PRODUCT FROM DELAYERING AND GRAPHIC DESIGN SYSTEM (GDS) HACKING AND METHOD FOR PRODUCING THE SAME

TECHNICAL FIELD

The present disclosure relates to the manufacture of semiconductor devices, such as integrated circuits (ICs). The present disclosure is particularly applicable to a technique for preventing reverse engineering or hacking of ICs.

BACKGROUND

The creation of ICs is an expensive undertaking hence some developers stoop to the contentious practice of reverse engineering. The practice of reverse engineering involves disassembling existing ICs, closely examining them to determine their physical structure, and copying the device, e.g., a design of an IC chip can be reproduced by delayering the metal/via layers. This results in economic loss to companies that have invested in expensive research and development efforts to design the ICs.

A need therefore exists for a methodology to prevent reverse engineering or hacking of ICs.

SUMMARY

An aspect of the present disclosure is a method of forming a stop layer to prevent a dummy via from connecting to a metal layer.

Another aspect of the present disclosure is a device with a stop layer to prevent a dummy via from connecting to a metal layer.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a first dielectric layer; forming a first metal layer in a portion of the first dielectric layer; forming a first Nblok layer over the first dielectric layer and the first metal layer; forming a second dielectric layer over the first Nblok layer; forming a second Nblok layer over a portion of the second dielectric layer; forming a third dielectric layer over the second dielectric layer and the second Nblok layer; forming a via and a plurality of vias through the third and second dielectric layers down to the second and first Nblok layers, respectively; removing portions of the second and first Nblok layers through the via and the plurality of vias down to the second dielectric layer and the first metal layer, respectively; and filling the via and the plurality of vias with a second metal layer.

Aspects of the present disclosure include removing portions of the third dielectric layer through the via and the plurality of vias, an upper portion of each via widened; and filling the via and the plurality of vias with the second metal layer. Another aspect includes forming the first metal layer in the portion of the first dielectric layer by copper (Cu) metallization with a dual damascene process. Further aspects include the Cu metallization with the dual damascene process including patterning the first dielectric layer; etching the first dielectric layer, forming a trench; filling the trench with the first metal layer by plasma vapor deposition (PVD) and Cu electroplating; and planarizing the metal layer by chemical mechanical polishing (CMP). Another aspect includes forming the second Nblok layer over a portion of the second dielectric layer by conformally forming the second Nblok layer over the second dielectric layer; forming a mask over a portion of the second Nblok layer; patterning and etching an exposed portion of the second Nblok layer down to the second dielectric layer; cleaning the second dielectric layer with dilute Hydrofluoric (HF) acid; and removing the mask. Additional aspects include forming the first and third dielectric layer of hydrogen-containing silicon oxycarbide (SiCOH) or tetraethyl orthosilicate (TEOS). Further aspects include forming the second dielectric layer of low temperature oxide (LTO), SiCOH or TEOS. Another aspect includes forming the first metal layer of tantalum (Ta) or tantalum nitride (TaN) and Cu. Additional aspects include forming the second metal layer of aluminum (Al), Cu or tungsten (W). Further aspects include forming the via and the plurality of vias by etching portions of the second and third dielectric layers by a gas mixture of methane/fluoroform/hexafluoroethane/argon/oxygen ($CH_4/CHF_3/C_2F_6/Ar/O_2$) or a plasma dry etch; and cleaning the second and third dielectric layers with deionized (DI) water.

Another aspect of the present disclosure is a device including: a first dielectric layer; a first metal layer in a portion of the first dielectric layer; a first Nblok layer over the first dielectric layer and the first metal layer; a second dielectric layer over the first Nblok layer; a second Nblok layer over a portion of the second dielectric layer; a third dielectric layer over the second dielectric layer and the second Nblok layer; and a via and a plurality of vias through the third and second dielectric layers down to the second and first Nblok layers, respectively, the via and the plurality of vias each filled with a second metal layer and having a wider upper portion.

Aspects of the device include the first and third dielectric layer including SiCOH or TEOS. Another aspect includes the second dielectric layer including LTO, SiCOH or TEOS. Other aspects include the first and second Nblok layers having a thickness of 2 nm to 50 nm. A further aspect includes the first metal layer including Ta or TaN and Cu. Additional aspects include the second metal layer including Al, Cu or W. Another aspect includes the wider upper portion of each via having a width of 10 nm to 200 nm, and the lower portion of each via having a width of 10 nm to 200 nm.

A further aspect of the present disclosure is a method including: forming a first dielectric layer of SiCOH or TEOS to a thickness of 5 nm to 500 nm and a width of 10 nm to 10,000 nm; forming a first metal layer of Ta or TaN and Cu to a thickness of 10 nm to 4000 nm and a width of 10 nm to 10,000 nm in a portion of the first dielectric layer by Cu metallization with a dual damascene process; forming a first Nblok layer to a thickness of 5 nm to 50 nm by chemical vapor deposition (CVD) over the first dielectric layer and the first metal layer; forming a second dielectric layer of LTO, SiCOH or TEOS to a thickness of 100 nm to 10,000 nm over the first Nblok layer; forming a second Nblok layer to a thickness of 2 nm to 50 nm over a portion of the second dielectric layer; forming a third dielectric layer of SiCOH or TEOS over the second dielectric layer and the second Nblok layer; forming a via and a plurality of vias to a width of 10 nm to 200 nm in pre-determined regions by a gas mixture of $CH_4/CHF_3/C_2F_6/Ar/O_2$ or a plasma dry etch through the third and second dielectric layers down to the second and first Nblok layers, respectively; removing portions of the second and first Nblok layers through the via and the plurality of vias by a gas mixture of $CH_4/CHF_3/C_2F_6/Ar/O_2$ or a plasma dry etch down to the second dielectric layer and the first metal layer, respectively; and filling the via and the plurality of vias with a second metal layer including Al, Cu or W.

Aspects of the present disclosure include the Cu metallization with the dual damascene process including patterning the first dielectric layer; etching the first dielectric layer, forming a trench; filling the trench with the first metal layer by PVD and Cu electroplating; and planarizing the metal layer by CMP. Another aspect includes removing portions of the third dielectric layer through the via and the plurality of vias, an upper portion of each via widened to a width of 10 nm to 200 nm; and filling the via and the plurality of vias with the second metal layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of reverse engineering or hacking of ICs attendant upon manufacture and sale of ICs. The problem is solved, inter alia, by forming a stop layer, e.g., of Nblok, SiCOH, silicon nitride (SiN) or TEOS to prevent the dummy via from connecting to a metal layer underneath.

Methodology in accordance with embodiments of the present disclosure includes forming a first dielectric layer. A first metal layer is formed in a portion of the first dielectric layer. A first Nblok layer is formed over the first dielectric layer and the first metal layer. A second dielectric layer is formed over the first Nblok layer. A second Nblok layer is formed over a portion of the second dielectric layer. A third dielectric layer is formed over the second dielectric layer and the second Nblok layer. A via and a plurality of vias are formed through the third and second dielectric layers down to the second and first Nblok layers, respectively. A portion of the second and first Nblok layers is removed through the via and the plurality of vias down to the second dielectric layer and the first metal layer, respectively. A portion of the third dielectric layer is removed through the via and the plurality of vias, an upper portion of each via widened and the via and the plurality of vias are filled with a second metal layer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
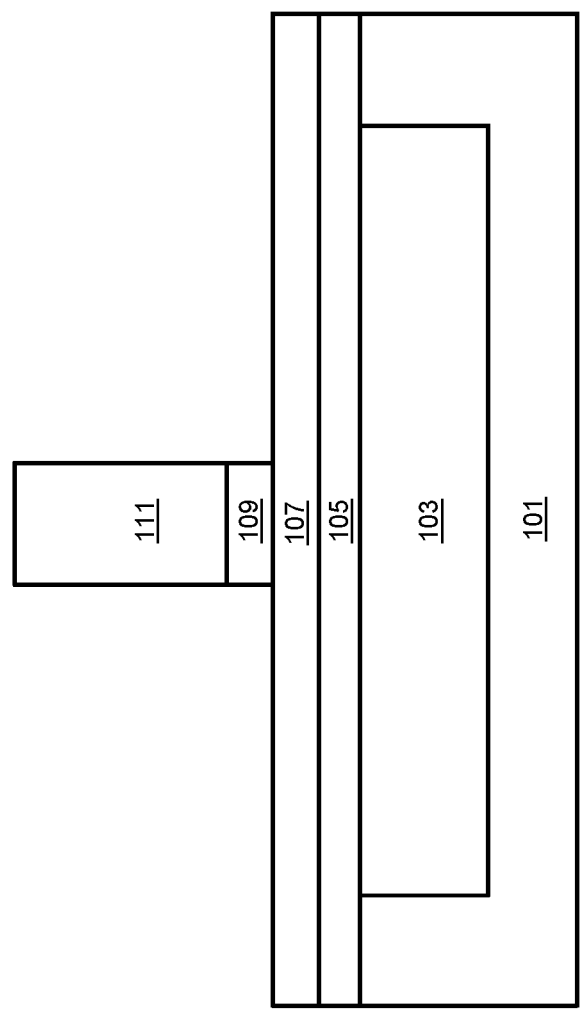
FIGS. 1 through 3 schematically illustrates cross-sectional views of a process flow for forming additional stop layers to prevent a dummy via from connecting to a metal layer, in accordance with an exemplary embodiment.
Figure 2:
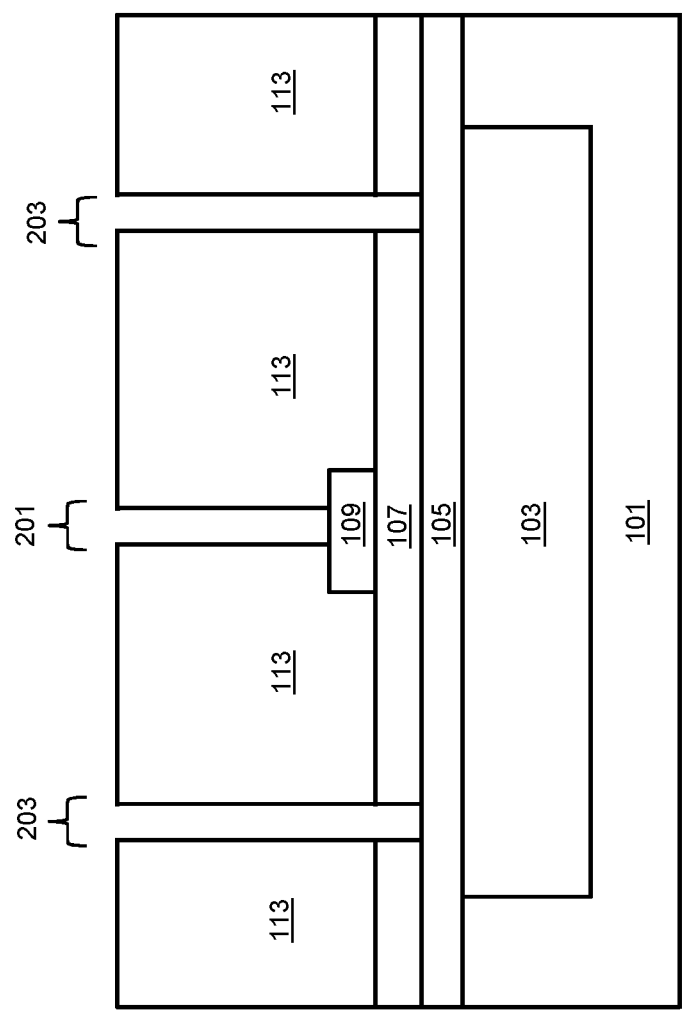
Figure 3:
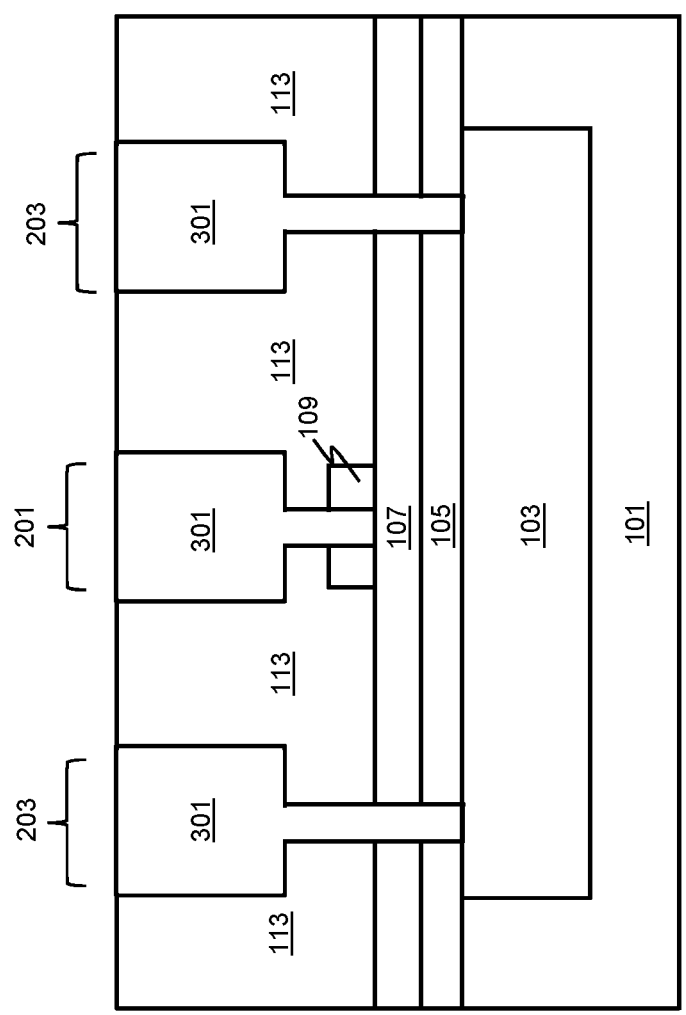

FIGS. 1 through 3 schematically illustrate cross-sectional views of a process flow for forming additional stop layers to prevent a dummy via from connecting to a metal layer, in accordance with an exemplary embodiment. Referring to FIG. 1, a dielectric layer 101 is formed, e.g., of SiCOH or TEOS to a thickness of 5 nm to 500 nm and to a width of 10 nm to 10,000 nm. A metal layer 103 is formed, e.g., by Cu metallization with a dual damascene process, in a portion of the dielectric layer 101. The Cu metallization with the dual damascene process includes patterning the dielectric layer 101, e.g., by lithography, and then etching, e.g., by a plasma dry etch, to form a trench (not shown for illustrative convenience) having a thickness, e.g., of 10 nm to 4,000 nm, and a width, e.g., of 10 nm to 10,000 nm. The trench is then filled with metal, e.g., Ta or TaN and Cu, e.g., by PVD, wherein the Cu is electroplated. Subsequently, the metal layer 103 is planarized by CMP. Next, an Nblok layer 105 is formed, e.g., by CVD in a plasma chamber with silane ($SiH_4$) gas and nitrogen (N) as precursor gas, to a thickness, e.g., of 5 nm to 50 nm, over the dielectric layer 101 and the metal layer 103. Then, a dielectric layer 107 is formed, e.g., of LTO, SiCOH or TEOS, to a thickness, e.g., of 100 nm to 10,000 nm, over the Nblok layer 105. Next, an Nblok layer 109 is formed under a mask 111, e.g., a dummy via protection mask, by conformally forming a Nblok layer (not shown for illustrative convenience), e.g., to a thickness of 2 nm to 50 nm and a width of 10 nm to 1,000 nm, over the dielectric layer 107; patterning the exposed portion of the Nblok layer, e.g., by lithography; and etching the Nblok layer, e.g., by a gas mixture of $CH_4/CHF_3/C_2F_6/Ar/O_2$ or a plasma dry etch, down to the dielectric layer 107. Next, the exposed dielectric layer 107 is cleaned with HF acid. Subsequently, the mask 111 is removed.

As illustrated in FIG. 2, a dielectric layer 113 is formed, e.g., of SiCOH or TEOS, to a thickness, e.g., of 100 nm to 10,000 nm, over the dielectric layer 107 and the Nblok layer 109. Next, the dielectric layers 113 and 107 are etched, e.g., by a gas mixture of $CH_4/CHF_3/C_2F_6/Ar/O_2$ or a plasma dry etch, in pre-determined regions down to the Nblok layers 109 and 105 and cleaned with DI water, forming vias 201 and 203. The vias 201 and 203 are formed to a width, e.g., of 10 nm to 200 nm. As depicted in FIG. 3, the Nblok layers 109 and 105 are etched, e.g., by a gas mixture of $CH_4/CHF_3/C_2F_6/Ar/O_2$ or a plasma dry etch, through the vias 201 and 203 down to the dielectric layer 107 and metal layer 103, respectively. Next, the upper portion of each via 201 and 203 is widened, e.g., by etching to a width, e.g., of 10 nm to 200 nm. Subsequently, the vias 201 and 203 are filled with a metal layer 301, e.g., formed of Ta or TaN and Cu. Consequently, the dummy via 201 is disguised as normal vias 203. Forming the dummy via 201 down to the dielectric layer 107 prevents the dummy via 201 from making contact with the metal layer 103 hence an electrical connection is not made. However, from a top down view of the IC, dummy via 201 appears to be a part of the wiring for the IC.

The embodiments of the present disclosure can achieve several technical effects including disguising a dummy via as a normal via to prevent reverse engineering of the GDS layout and to make subsequent detection of such efforts more readily apparent. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of IC devices with vias.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a first dielectric layer;
   forming a first metal layer in a portion of the first dielectric layer;
   forming a first Nblok layer over the first dielectric layer and the first metal layer;
   forming a second dielectric layer over the first Nblok layer;
   forming a second Nblok layer over a portion of the second dielectric layer;
   forming a third dielectric layer over the second dielectric layer and the second Nblok layer;
   forming a via and a plurality of vias through the third and second dielectric layers down to the second and first Nblok layers, respectively;
   removing portions of the second and first Nblok layers through the via and the plurality of vias down to the second dielectric layer and the first metal layer, respectively; and
   filling the via and the plurality of vias with a second metal layer.

2. The method according to claim 1, further comprising:
   removing portions of the third dielectric layer through the via and the plurality of vias, an upper portion of each via widened; and
   filling the via and the plurality of vias with the second metal layer.

3. The method according to claim 1, comprising forming the first metal layer in the portion of the first dielectric layer by copper (Cu) metallization with a dual damascene process.

4. The method according to claim 3, wherein the Cu metallization with the dual damascene process comprises:
   patterning the first dielectric layer;
   etching the first dielectric layer, forming a trench;
   filling the trench with the first metal layer by plasma vapor deposition (PVD) and copper (Cu) electroplating; and
   planarizing the metal layer by chemical mechanical polishing (CMP).

5. The method according to claim 1, comprising forming the second Nblok layer over a portion of the second dielectric layer by:
   conformally forming the second Nblok layer over the second dielectric layer;
   forming a mask over a portion of the second Nblok layer;
   patterning and etching an exposed portion of the second Nblok layer down to the second dielectric layer;
   cleaning the second dielectric layer with dilute Hydrofluoric (HF) acid; and
   removing the mask.

6. The method according to claim 1, comprising forming the first and third dielectric layer of hydrogen-containing silicon oxycarbide (SiCOH) or tetraethyl orthosilicate (TEOS).

7. The method according to claim 1, comprising forming the second dielectric layer of low temperature oxide (LTO), SiCOH or TEOS.

8. The method according to claim 1, comprising forming the first metal layer of tantalum (Ta) or tantalum nitride (TaN) and Cu.

9. The method according to claim 1, comprising forming the second metal layer of aluminum (Al), Cu or tungsten (W).

10. The method according to claim 1, comprising forming the via and the plurality of vias by:
    etching portions of the second and third dielectric layers by a gas mixture of methane/fluoroform/hexafluoroethane/argon/oxygen ($CH_4/CHF_3/C_2F_6/Ar/O_2$) or a plasma dry etch; and
    cleaning the second and third dielectric layers with deionized (DI) water.

11. A device comprising:
    a first dielectric layer;
    a first metal layer in a portion of the first dielectric layer;
    a first Nblok layer over the first dielectric layer and the first metal layer;
    a second dielectric layer over the first Nblok layer;
    a second Nblok layer over a portion of the second dielectric layer;
    a third dielectric layer over the second dielectric layer and the second Nblok layer; and
    a via and a plurality of vias through the third and second dielectric layers down to the second and first Nblok layers, respectively, the via and the plurality of vias each filled with a second metal layer and having a wider upper portion.

12. The device according to claim 11, wherein the first and third dielectric layer comprises hydrogen-containing silicon oxycarbide (SiCOH) or tetraethyl orthosilicate (TEOS).

13. The device according to claim 11, wherein the second dielectric layer comprises low temperature oxide (LTO), SiCOH or TEOS.

14. The device according to claim 11, wherein the first and second Nblok layers have a thickness of 2 nanometer (nm) to 50 nm.

15. The device according to claim 11, wherein the first metal layer comprises tantalum (Ta) or tantalum nitride (TaN) and Copper (Cu).

16. The device according to claim 11, wherein the second metal layer comprises aluminum (Al), Cu or tungsten (W).

17. The device according to claim 11, wherein the wider upper portion of each via has a width of 10 nm to 200 nm, and the lower portion of each via has a width of 10 nm to 200 nm.

18. A method comprising:
forming a first dielectric layer of hydrogen-containing silicon oxycarbide (SiCOH) or tetraethyl orthosilicate (TEOS) to a thickness of 5 nanometer (nm) to 500 nm and a width of 10 nm to 10,000 nm;
forming a first metal layer of tantalum (Ta) or tantalum nitride (TaN) and Copper (Cu) to a thickness of 10 nm to 4000 nm and a width of 10 nm to 10,000 nm in a portion of the first dielectric layer by Cu metallization with a dual damascene process;
forming a first Nblok layer to a thickness of 5 nm to 50 nm by chemical vapor deposition (CVD) over the first dielectric layer and the first metal layer;
forming a second dielectric layer of low temperature oxide (LTO), SiCOH or TEOS to a thickness of 100 nm to 10,000 nm over the first Nblok layer;
forming a second Nblok layer to a thickness of 2 nm to 50 nm over a portion of the second dielectric layer;
forming a third dielectric layer of SiCOH or TEOS over the second dielectric layer and the second Nblok layer;
forming a via and a plurality of vias to a width of 10 nm to 200 nm in pre-determined regions by a gas mixture of methane/fluoroform/hexafluoroethane/argon/oxygen ($CH_4/CHF_3/C_2F_6/Ar/O_2$) or a plasma dry etch through the third and second dielectric layers down to the second and first Nblok layers, respectively;
removing portions of the second and first Nblok layers through the via and the plurality of vias by a gas mixture of $CH_4/CHF_3/C_2F_6/Ar/O_2$ or a plasma dry etch down to the second dielectric layer and the first metal layer, respectively; and
filling the via and the plurality of vias with a second metal layer comprising aluminum (Al), Cu or tungsten (W).

19. The method according to claim 18, wherein the Cu metallization with the dual damascene process comprises:
patterning the first dielectric layer;
etching the first dielectric layer, forming a trench;
filling the trench with the first metal layer by plasma vapor deposition (PVD) and Cu electroplating; and
planarizing the metal layer by chemical mechanical polishing (CMP).

20. The method according to claim 18, further comprising:
removing portions of the third dielectric layer through the via and the plurality of vias, an upper portion of each via widened to a width of 10 nm to 200 nm; and
filling the via and the plurality of vias with the second metal layer.

* * * * *